United States Patent [19]
Kim

[11] Patent Number: 5,933,036
[45] Date of Patent: Aug. 3, 1999

[54] POWER-ON RESET SIGNAL GENERATING CIRCUIT

[75] Inventor: Seog-Jin Kim, Chungcheongbuk-do, Rep. of Korea

[73] Assignee: LG Semicon Co., Ltd., Chungcheongbuk-do, Rep. of Korea

[21] Appl. No.: 08/887,933

[22] Filed: Jul. 3, 1997

[30] Foreign Application Priority Data

Aug. 24, 1996 [KR] Rep. of Korea .................... 96-35332

[51] Int. Cl.⁶ ................................................ H03L 7/00
[52] U.S. Cl. .......................................... 327/143; 327/198
[58] Field of Search ................................ 327/50, 51, 57, 327/142, 143, 198

[56] References Cited

U.S. PATENT DOCUMENTS 5,109,163  4/1992  Benhamida .................... 307/272.3
5,739,708  4/1998  LeWalter ....................... 327/143
5,760,577  6/1998  Shizuya ....................... 324/207.16

*Primary Examiner*—Timothy P. Callahan
*Assistant Examiner*—Jeffrey Zweizig

[57] ABSTRACT

A power-on reset signal generating circuit includes an oscillation circuit for generating an alternating signal, and a level sensing type switching circuit for detecting when the alternating signal of the oscillation circuit is above a predetermined level and changing its output level based on the detection. The level sensing type switching circuit includes a level sensing circuit for generating a level sensing signal, and a switching circuit for receiving the output of the level sensing circuit and switching the connection state of the circuit. The switching circuit includes a MOS transistor switch whose one gate is connected to the output of the level sensing circuit and whose one end is connected to the power source, a resistor, a capacitor chargeable by the power source through the MOS transistor switch and the resistor, and an inverter for inverting the output of the charged voltage when it is above a predetermined level.

24 Claims, 5 Drawing Sheets

POWER-ON RESET SIGNAL GENERATING CIRCUIT

BACKGROUND OF THE INVENTION

1. Field of the Invention

The present invention relates to a power-on reset signal generating circuit and, more particularly, to a power-on reset signal generating circuit and method which prevents system malfunctions generated from an improper timing of a power-on reset signal.

2. Discussion of Related Art

FIG. 1 shows a conventional power-on reset signal generating circuit.

Referring to FIG. 1, the conventional power-on reset signal generating circuit is constructed so that a power voltage Vdd charges a condenser C1 through a resistor R1. The output at node A is inverted through an inverter INV1 and output as a signal POR. The output signal POR is at a "low" level when the charging voltage of the condenser C1 reaches above a "high" input level of the inverter INV1.

FIG. 2 shows a voltage waveform for explaining the operation of the circuit shown in FIG. 1.

Referring to FIG. 2, as the power is applied at time t=0, the level of power voltage Vdd is gradually increased and the voltage at node A reaches the "high" input level of inverter INV1 at time t=tr. Then the output of inverter INV1, which is the power-on reset signal POR, changes to a "low" level.

The level of the reset signal generated from the above-described circuit changes after a predetermined time t=tr is elapsed once the power is on at t=0. This signal level variation causes a generation of unstable reset signals, especially in microcomputer systems driven by an external oscillation clock. In such systems, the level of a reset signal generated by the conventional generating circuit can change before the external oscillation clock circuit is stabilized, resulting in system malfunctions.

In case of using a conventional external oscillator which includes a crystal resonator XL and a resistor R2 connected across the terminals of an inverter INV2 as shown in FIG. 3, the output of the conventional external oscillator behaves normally only after the time corresponding to t=ts is elapsed after the power is applied at time t=0, as shown in FIG. 4. Thus, if the reset time is shorter than time t=ts, a system malfunction occurs.

In order to solve the above-described problem, it has been suggested to increase the reset time. However, a longer reset time slows down the operation speed of the system. But if the reset time is short, the system may malfunction. Accordingly, there is a great need to address such problems of the conventional power-on reset signal generating circuit.

SUMMARY OF THE INVENTION

Accordingly, the present invention is directed to a power-on reset signal generating circuit that substantially obviates one or more problems due to limitations and disadvantages of the related art.

An object of the present invention is to provide a power-on reset signal generating circuit having an oscillation circuit and a level sensing type switching circuit, whose reset time period ends after an oscillation waveform of the oscillation circuit is stabilized.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, a power-on reset signal generating circuit includes an oscillation circuit for generating an alternating signal, and a level sensing type switching circuit for detecting when the alternating signal of the oscillation circuit is above a predetermined level and changing its output signal level according to the detection. The alternating signal is an oscillating signal, such as a rectangular wave or a sine wave. A clock generator employed in the system may function as the oscillation circuit.

The level sensing type switching circuit includes a level sensing circuit and a switching circuit. The level of a level sensing signal generated by the level sensing circuit changes when the output level of the oscillation circuit reaches a predetermined level. The switching circuit receives the level sensing signal of the level sensing circuit, and generates a power-on reset signal through an inverter when a switch which connects a time constant circuit to a power source is turned on and when the voltage of the time constant circuit is above a predetermined level.

It is to be understood that both the foregoing general description and the following detailed description are exemplary and explanatory and are intended to provide further explanation of the invention as claimed.

Briefly described, the present invention is directed to a power-on reset signal generating circuit comprising an oscillation circuit for generating an alternating signal, and switching means for processing the alternating signal and changing a level of its output signal after the alternating signal generated from the oscillation circuit reaches a first predetermined level.

Furthermore, the present invention is directed to a method for generating a power-on reset, comprising the steps of generating an alternating signal processing the alternating signal, and changing a level of an output signal when the alternating signal is above a predetermined level.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, wherein.

DETAILED DESCRIPTION OF PREFERRED EMBODIMENTS

Reference will now be made in detail to the preferred embodiments of the present invention, examples of which are illustrated in the accompanying drawings.

Figure 5:
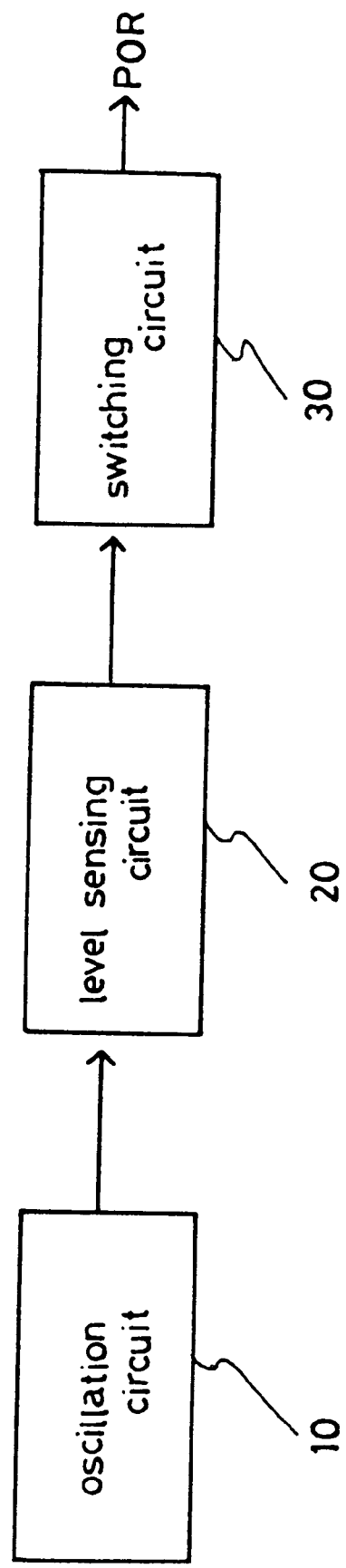
FIG. 5 is a block diagram of a power-on reset signal generating circuit according to the embodiments of the present invention.

FIG. 5 is a block diagram of a power-on reset signal generating circuit according to the embodiment of the present invention.

Referring to FIG. 5, the power-on reset signal generating circuit of the present invention includes an oscillation circuit 10 for generating an alternating signal, and a level sensing type switching circuit for changing the level of a signal to be output therefrom when the alternating signal of the oscillation circuit 10 is above a predetermined level.

The level sensing type switching circuit includes a level sensing circuit 20 and a switching circuit 30. The level sensing circuit 20 generates a level sensing signal whose signal level is changed when the alternating signal reaches above the predetermined level. The switching circuit 30 receives the output of the level sensing circuit 20 to thereby turn on the connection of the power-on reset signal generating circuit.

Figure 6:
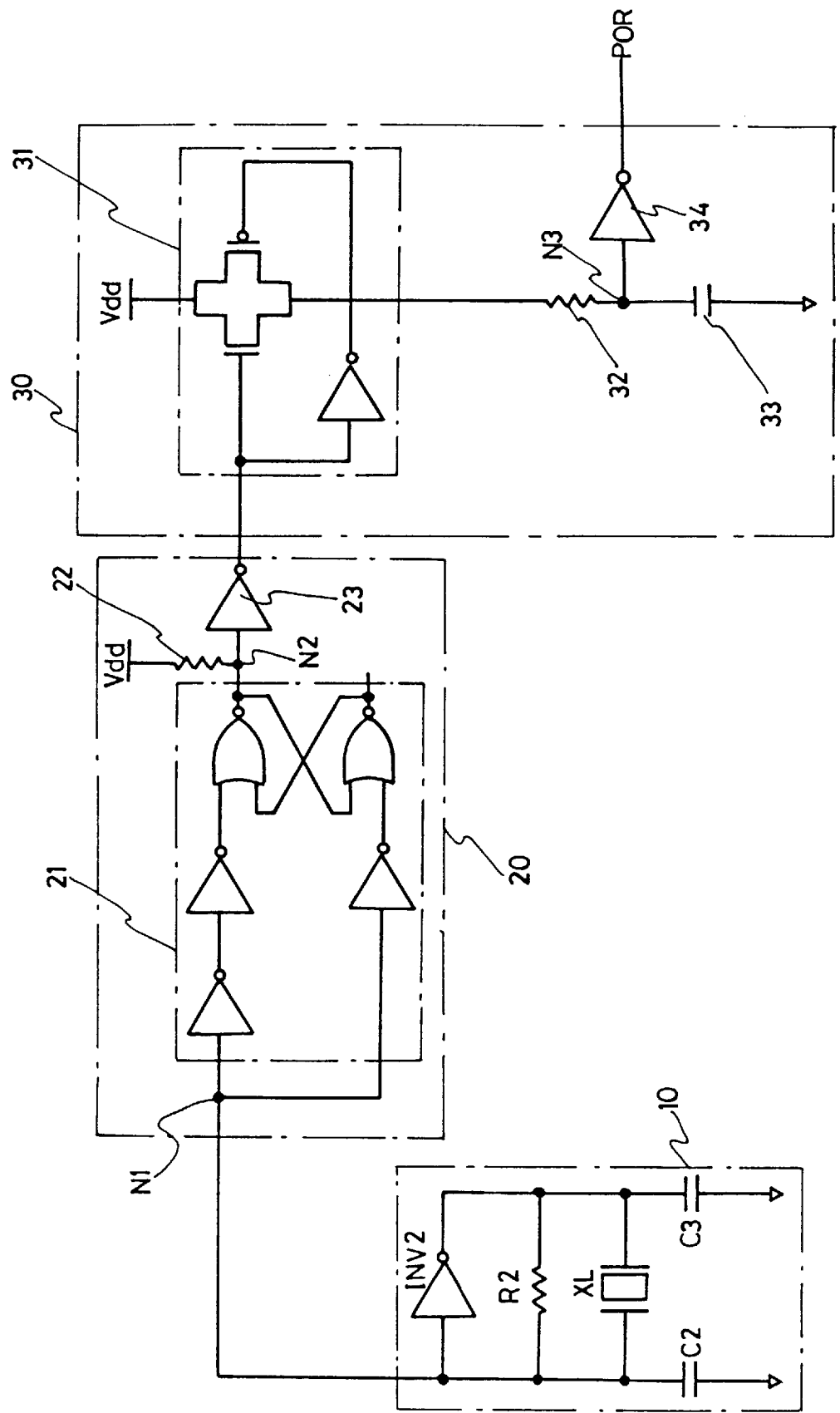
FIG. 6 is a circuit diagram of the power-on reset signal generating circuit according to the embodiments of the present invention.

FIG. 6 is an example of a circuit diagram of the power-on reset signal generating circuit according to the embodiments of the present invention.

Figure 1:
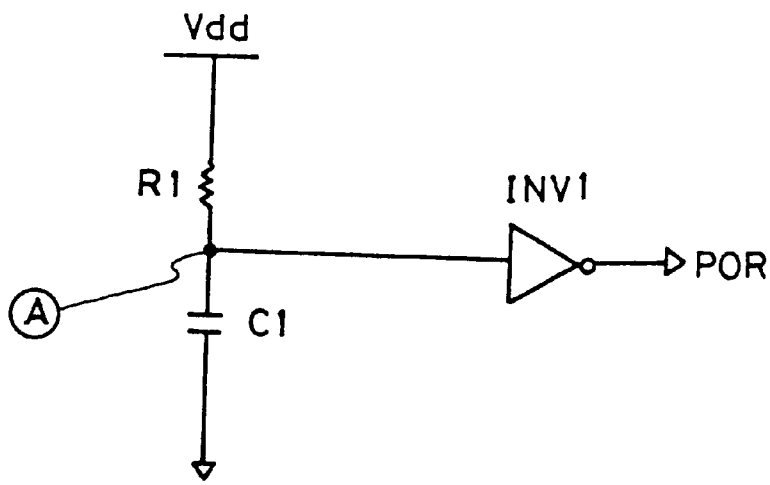
FIG. 1 is a circuit diagram of a conventional power-on reset signal generating circuit.
Figure 2:
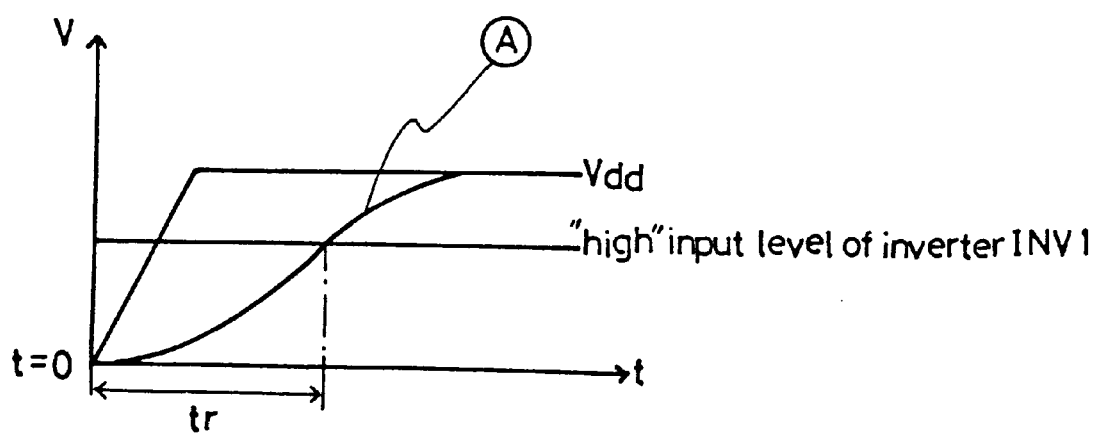
FIG. 2 shows a voltage waveform for explaining the circuit of FIG. 1.
Figure 3:
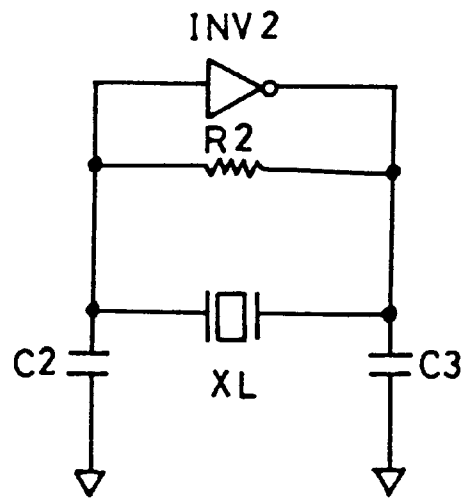
FIG. 3 is a circuit diagram of an oscillation circuit.
Figure 4:
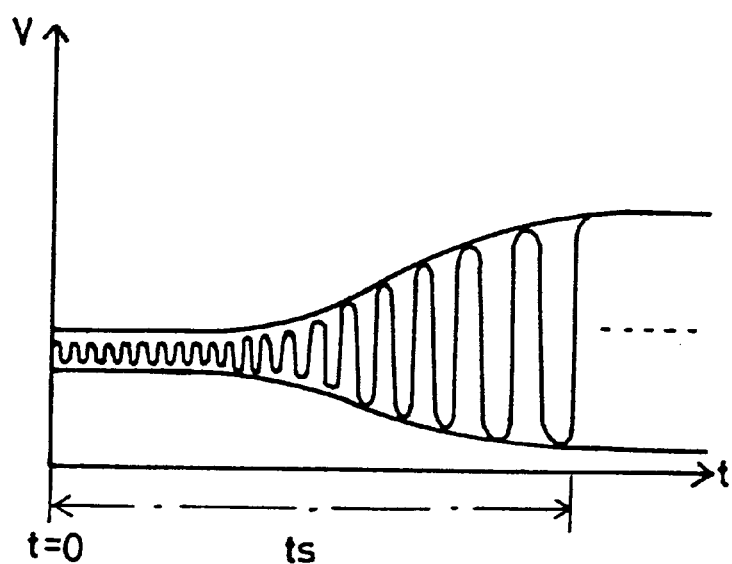
FIG. 4 is a waveform diagram of an oscillation signal output from the circuit of FIG. 3.

Referring to FIG. 6, the oscillation circuit 10, which may be the same as or different from the conventional oscillation circuit shown in FIG. 3, is connected to node N1 of the level sensing circuit 20. The level sensing circuit 20 includes a schmitt trigger circuit 21 connected to the output of oscillation circuit 10, a resistor 22 connected to the output of the schmitt circuit 21 and a power source (e.g., Vdd), and an inverter 23 for inverting the output of the schmitt circuit 21. Any kind of a conventional schmitt trigger circuit can be used in this embodiment.

The switching circuit 30 includes a MOS transistor switch 31 whose one gate is connected to the output of inverter 23 of the level sensing circuit 20 and whose one end is connected to a power source Vdd, a resistor 32, a capacitor 33 charged with the power voltage through the MOS transistor switch 31 and resistor 32, and an inverter 34 for generating an output signal POR when the voltage charged in the capacitor 33 is above a predetermined level. Here, a circuit formed with the resistor 32, the capacitor 33 and the inverter 34, which is the same as the conventional POR signal generating circuit, can be formed without the resistor 32.

FIGS. 7A–7D show waveforms for explaining an operation of the power-on reset signal generating circuit of FIG. 6.

As shown in FIGS. 7A–7D, the horizontal axis shows a time extending from the power-on point, and the vertical axis shows the magnitude of the voltage generated at different nodes. The operation of the power-on reset signal generating circuit according to the present invention will be explained below.

Figure 7A:
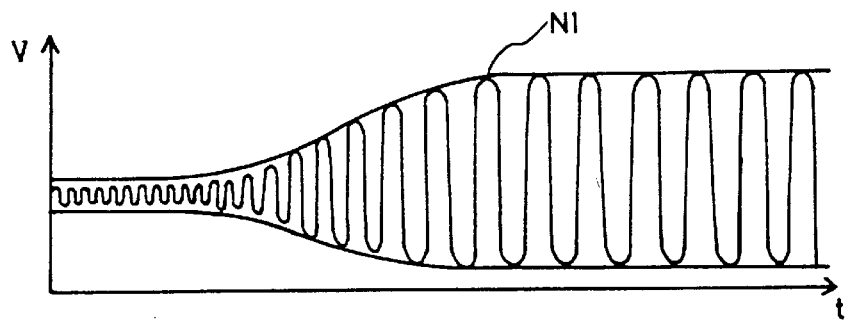
FIGS. 7A–7D show waveforms for explaining an operation of the power-on reset signal generating circuit of FIG. 6 according to the embodiments of the present invention.

When the power is applied, the oscillation circuit 10 starts oscillating. At first, the amplitude of the output waveform of the oscillation circuit 10 at node N1 is very small as shown in FIG. 7A. The amplitude of the output waveform gradually increases as the time passes and saturates at a predetermined level.

Figure 7B:
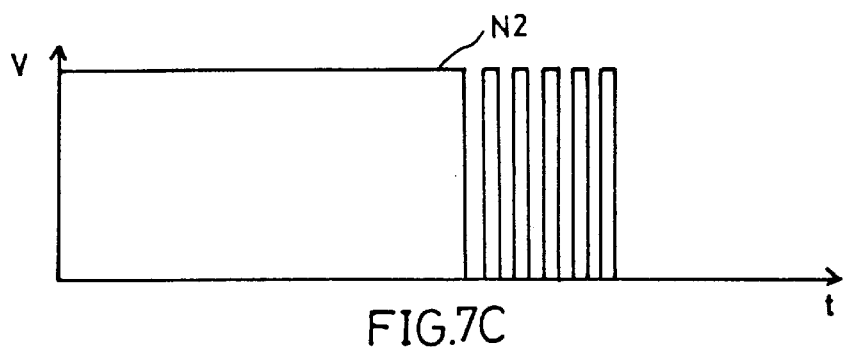

As shown in FIG. 7B, the output of the schmitt trigger circuit 21 at node N2 is initially in a "high" level state because the voltage Vdd is applied through the resistor 22. When the output level of the oscillation circuit 10 is increased to a level above the trigger level of the schmitt circuit 21, the output of the schmitt circuit 21 changes to a "low" level and then a "high" level according to the oscillating waveform of the oscillation circuit 10. This level sensing signal is output to the switching circuit 30 through the inverter 23. This signal indicates when the alternating signal reaches a predetermined level.

Figure 7C:
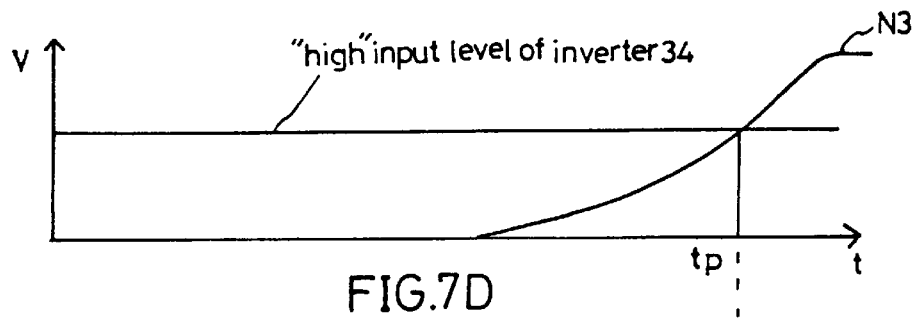
Figure 7D:
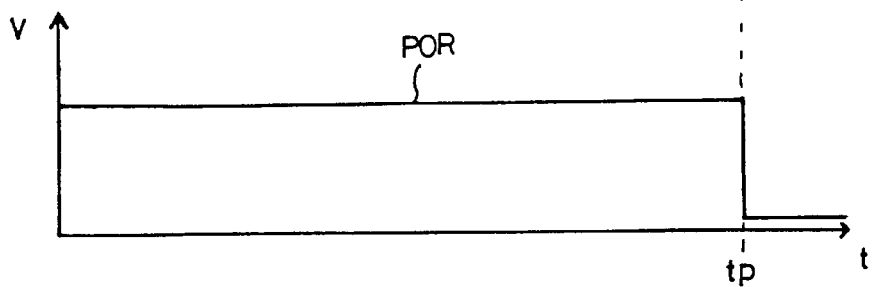

As shown in FIG. 7C, at node N3, the charging voltage of capacitor 33 is initially in a "low" state since the MOS transistor switch 31 is in the "off" state. When the output of level sensing circuit 20 begins to fluctuate between "high" and "low" levels, the charging voltage gradually increases because the capacitor 33 starts to be charged by the application of the power voltage Vdd as the switch 31 is turned on. The charging voltage of the capacitor 33 reaches the predetermined "high" input level of inverter 34 at t=tp. At this point, the output of inverter 34 is inverted from a "high" level to a "low" level (at time t=tp) as shown in FIG. 7D, so as to generate an improved reset signal POR which is provided after the oscillation is stabilized.

In the above-described power-on reset signal generating circuit of the present invention, the power-on reset signal is generated after the clock signal used in a microsystem is stabilized. Accordingly, the present invention includes a circuitry which allows the reset signal to be generated only after a clock signal to the system is stabilized, to thereby prevent system malfunctions.

It will be apparent to those skilled in the art that various modifications and variations can be made in the power-on reset signal generating circuit of the present invention without departing from the spirit or scope of the invention. Thus, it is intended that the present invention cover the modifications and variations of this invention provided they come within the scope of the appended claims and their equivalents.

What is claimed is:

1. A power-on reset signal generating circuit comprising:
    an oscillation circuit for generating an alternating signal; and
    a switching unit for processing the alternating signal and changing a level of an output signal of the switching unit after the alternating signal generated from the oscillation circuit reaches a first predetermined level to generate a power-on reset signal.

2. The circuit as claimed in claim 1, wherein the switching unit includes:
    a level sensing circuit for generating a level sensing signal based on the alternating signal; and
    a switching circuit for changing a level of said output signal based on the level sensing signal.

3. The circuit as claimed in claim 2, wherein the level sensing circuit includes:
    a schmitt trigger circuit, connected to the oscillation circuit, for detecting when the alternating signal is at the first predetermined level and generating the level sensing signal based on the detection.

4. The circuit as claimed in claim 3, wherein the level sensing circuit includes:
    a resistor for connecting an output of the schmitt trigger circuit to a power source; and
    an inverter for inverting the output of the schmitt trigger circuit.

5. The circuit as claimed in claim 1, wherein the switching unit includes:

a semiconductor transistor switch connected to a power source.

6. The circuit as claimed in claim 2, wherein the switching unit includes:
   a switch connected to an output of the level sensing circuit and to a power source.

7. The circuit as claimed in claim 5, wherein the switching means includes:
   a capacitor chargeable by the power source through the switch.

8. The circuit as claimed in claim 7, wherein the switching unit includes:
   an inverter for inverting a voltage signal charged by the capacitor when the voltage signal is above a second predetermined level.

9. The circuit a claimed in claim 8, wherein the second predetermined level is a high input level of the inverter.

10. The circuit as claimed in claim 1, wherein the switching unit includes a trigger circuit which generates a level sensing signal based on the alternating signal.

11. The circuit as claimed in claim 10, wherein a level state of the level sensing signal changes when the alternating signal is above a trigger level of the trigger circuit.

12. A method for generating a power-on reset signal, comprising the steps of:
   generating an alternating signal;
   processing the alternating signal; and
   changing a level of an output signal when the alternating signal is above a predetermined level to generate a power-on reset signal.

13. The method as claimed in claim 12, wherein the processing step includes the step of:
   generating a level sensing signal based on the alternating signal, a level state of the level sensing signal changing when the alternating signal is above the predetermined level.

14. The method as claimed in claim 13, wherein the step of generating a level sensing signal includes the steps of:
   providing a schmitt trigger circuit for detecting when the alternating signal is at the predetermined level, and
   generating the level sensing signal based on the detection.

15. The methods as claimed in claim 14, wherein the predetermined level is a trigger level of the schmitt trigger circuit.

16. The method as claimed in claim 13, wherein the processing step includes the step of:
   inverting the level sensing signal.

17. The method as claimed in claim 12, wherein the changing step includes the steps of:
   providing a switch connected to a power source to control the changing of the level of the output signal.

18. The method as claimed in claim 17, wherein the changing step includes the step of:
   charging a capacitor by the power source through the switch to generate the output signal.

19. The method as claimed in claim 18, wherein the changing step includes the step of:
   inverting a voltage signal charged by the capacitor when the voltage signal is above a reference level, to generate the output signal.

20. The method as claimed in claim 19, wherein the reference level is a high input level of an inverter used to perform the inverting step.

21. A power-on reset signal generating device comprising:
   an oscillating circuit for generating an alternating signal;
   a level sensing circuit for detecting when the alternating signal is at a first predetermined level, and generating a level sensing signal based on this detection, wherein the level sensing signal begins to oscillate after the alternating signal reaches the first predetermined level; and
   a switching circuit for changing a level of its output signal based on the level sensing signal to generate a power-on reset signal.

22. The device as claimed in claim 21, wherein the level sensing circuit includes:
   a trigger circuit, connected to the oscillation circuit, for detecting when the alternating signal is at the first predetermined level; and
   an inverter for inverting an output of the trigger circuit to generate the level sensing signal.

23. The device as claimed in claim 21, wherein the switching circuit includes:
   a switch connected to an output of the level sensing circuit and to a power source; and
   a capacitor chargeable by the power source through the switch.

24. The device as claimed in claim 23, wherein the switching circuit further includes:
   an inverter for inverting a voltage signal charged by the capacitor when the voltage signal is above a second predetermined level to generate the power-on reset signal.

\* \* \* \* \*